(12) United States Patent
Baughen et al.

(10) Patent No.: US 10,770,164 B1
(45) Date of Patent: Sep. 8, 2020

(54) SOFT POST PACKAGE REPAIR FUNCTION VALIDATION

(71) Applicant: International Business Machines Corporation, Armonk, NY (US)

(72) Inventors: Devon Baughen, Austin, TX (US); Richard D. Wheeler, Millerton, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/401,455

(22) Filed: May 2, 2019

(51) Int. Cl.
 G11C 29/00 (2006.01)
 G11C 29/38 (2006.01)
 G11C 29/44 (2006.01)

(52) U.S. Cl.
 CPC .............. *G11C 29/38* (2013.01); *G11C 29/44* (2013.01)

(58) Field of Classification Search
 None
 See application file for complete search history.

(56) References Cited

U.S. PATENT DOCUMENTS

| | | | |
|---|---|---|---|
| 9,165,679 B2 | 10/2015 | Oh et al. | |
| 9,406,403 B2* | 8/2016 | Loh | G11C 29/76 |
| 9,666,308 B2 | 5/2017 | Noh | |
| 9,870,293 B2 | 1/2018 | Lee et al. | |
| 9,870,837 B1 | 1/2018 | Shim | |
| 9,922,729 B2 | 3/2018 | Wilson et al. | |
| 10,068,661 B2 | 9/2018 | Warnes et al. | |
| 2011/0113280 A1* | 5/2011 | Chickanosky | G11C 29/4401 714/6.12 |
| 2016/0098280 A1* | 4/2016 | Yoon | G11C 17/16 713/2 |
| 2016/0300627 A1* | 10/2016 | You | G11C 17/16 |
| 2017/0084350 A1 | 3/2017 | Benedict et al. | |
| 2017/0169905 A1 | 6/2017 | Walton et al. | |
| 2017/0185499 A1* | 6/2017 | Lee | G11C 29/785 |
| 2017/0256326 A1* | 9/2017 | You | G11C 29/4401 |

(Continued)

OTHER PUBLICATIONS

Y. Lee, J. Lee, C. Kim, S. Cha and H. Yoon, "An Efficient Self Post Package Repair Algorithm and Implementation in Memory System with on-chip-EGG," 2006 IEEE Asian Solid-State Circuits Conference, Hangzhou, 2006, pp. 331-334. (Year: 2006).*

(Continued)

*Primary Examiner* — Daniel F. McMahon
(74) *Attorney, Agent, or Firm* — Cantor Colburn LLP; Bryan Bortnick

(57) ABSTRACT

Aspects include performing validation of a soft post-package repair (sPPR) function of a memory device by writing a first pattern to a first target row of a bank group of the memory device, executing the sPPR function on the first target row to change a mapping of the first target row to a spare row and divert a subsequent memory access request targeting the first target row to the spare row. A second pattern is written to the first target row. The sPPR function is executed on a second target row of the bank group to change a mapping of the second target row to the spare row and restore the mapping of the first target row. The first target row is read to confirm the first pattern. The second target row is read to confirm the second pattern and remapping of the second target row to the spare row.

20 Claims, 7 Drawing Sheets

(56) References Cited

U.S. PATENT DOCUMENTS

| | | |
|---|---|---|
| 2017/0308447 A1 | 10/2017 | Wu |
| 2017/0344421 A1 | 11/2017 | Brandl |
| 2018/0173595 A1 | 6/2018 | Kim et al. |
| 2018/0240534 A1 | 8/2018 | Yoko |
| 2018/0247699 A1* | 8/2018 | Pope .................. G11C 29/4401 |
| 2018/0261297 A1* | 9/2018 | Kim ....................... G11C 29/04 |

OTHER PUBLICATIONS

Greenberg, Marc; "Reliability, Availability, and Serviceability (RAS) for DDR DRAM Interfaces", Synopsys Incorporation, pp. 1-28, Oct. 15, 2014.

Kasamsetty, Kishore; "DRAM Scaling Challenges and Solutions in LPDDR4 Context", MemCon 2014 Conference on, Cadence, pp. 1-19, Oct. 15, 2014.

Kim et al.; "RelaxFault Memory Repair", ISCA'16 43th ACM SIGARCH International Symposium on Computer Architecture News, vol. 44, Issue 3, pp. 645-657, Jun. 18-22, 2016.

Wada et al.; "Post-Packaging Auto Repair Techniques for Fast Row Cycle Embedded DRAM", IEEE International Conference on Test, pp. 1016-1023, Oct. 16-28, 2004.

* cited by examiner

SOFT POST PACKAGE REPAIR FUNCTION VALIDATION

BACKGROUND

The present invention relates to computer systems, and more particularly, to soft post package repair function validation for a memory device.

Memory subsystems may make use of multiple types of error checking, correction and reporting mechanisms to improve recoverability, availability, and serviceability (RAS) and data integrity. In higher-end systems, such as mainframes, it is typical for data to be checked, corrected and reported upon in many places within write and read paths. The write and read paths can include checking, correction and reporting from a memory control to a physical memory interface through chip packaging, board routing across a board into a memory device, and return paths. As memory technology has evolved, the amount of checking, correction, and reporting included in memory subsystems has expanded to enable higher speed and higher density technologies.

Soft Post Package Repair (sPPR) provides a function in a memory device to quickly, but temporarily, repair a row element in a bank group on some types of memory devices by using a spare row of the memory device. One sPPR is allowed per bank group for some types of memory devices, such as a double-data rate fourth-generation (DDR4) dynamic random access memory (DRAM) device. If more than one sPPR request is made to the same bank group, the most recent sPPR address replaces the earlier issued address. Invalid deployment of sPPR or an out-of-specification design of a memory device can lead to memory device traffic not being diverted to the spare row of the memory device.

SUMMARY

According to one or more embodiments of the present invention, a method includes performing a validation of a soft post package repair (sPPR) function of a memory device. The validation includes writing a first pattern to a first target row of a bank group of the memory device, executing the sPPR function on the first target row to change a mapping of the first target row to a spare row of the memory device and divert a subsequent memory access request targeting the first target row to the spare row, and reading the first target row to confirm that data read from a memory row mapped to the first target row is a mismatch to the first pattern. A second pattern is written to the first target row. The sPPR function is executed on a second target row of the bank group to change a mapping of the second target row to the spare row and restore the mapping of the first target row. The first target row is read to confirm the first pattern and restoration of the mapping of the first target row from the spare row. The second target row is read to confirm the second pattern and remapping of the second target row to the spare row. A result of the validation is reported.

Other embodiments of the invention implement the features of the above-described method in a system and in a computer program product.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
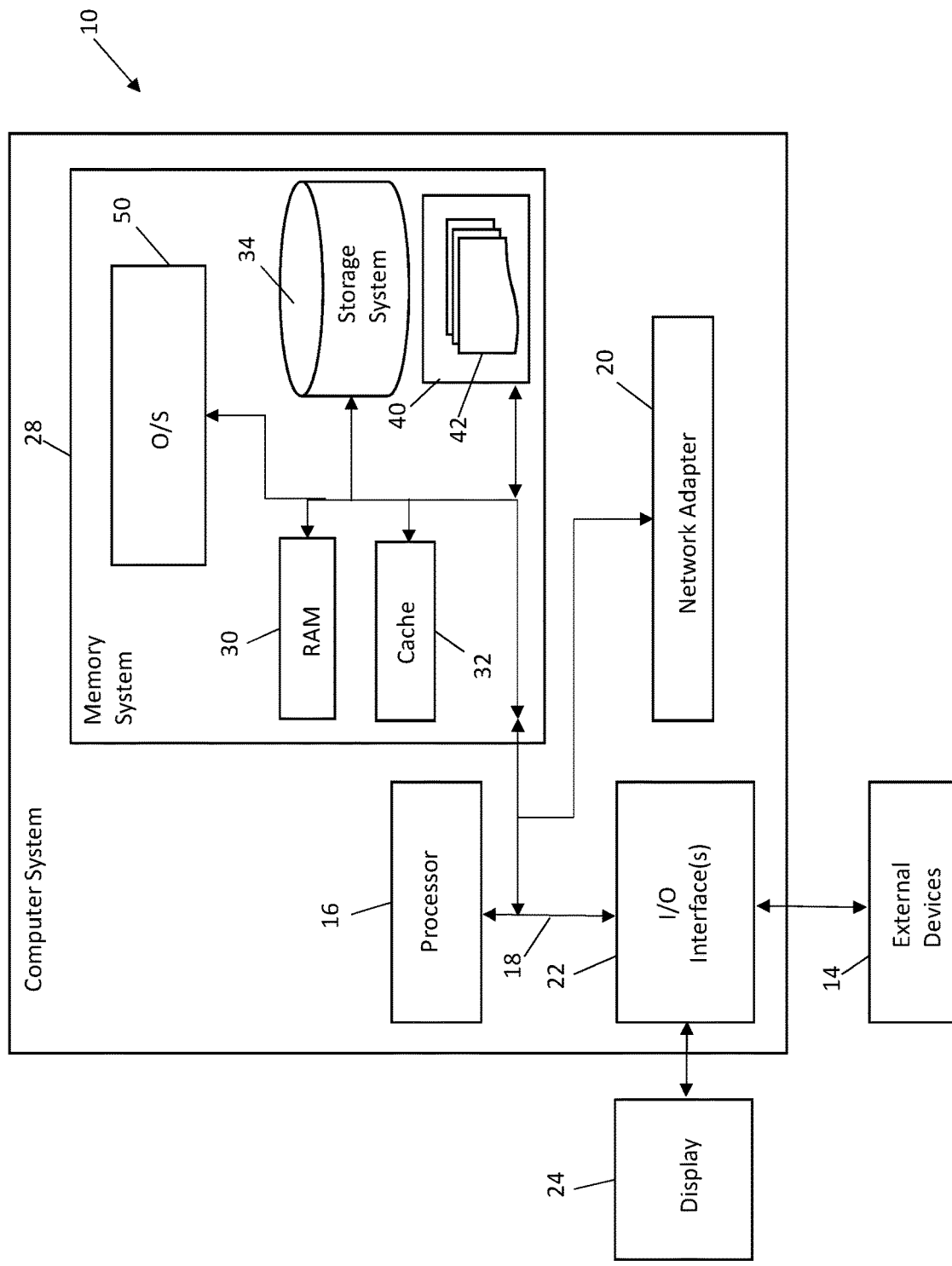
FIG. 1 is a block diagram illustrating a computer system in accordance with various embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, dynamic random access memory (DRAM) can be implemented according to standard defining certain features for each generation. For example, double data rate fourth generation (DDR4) DRAM can use different signaling voltages, physical interfaces, clock frequencies, and the like as compared to other generations, such as DDR3 and DDR5. Error checking, correction and reporting has grown from simple parity protection across a data bus, to error correcting codes (ECC) across the data bus, to ECC across the data bus with cyclic redundancy checks (CRC) over a complete DDR burst transaction, and further ECC within each device itself. Chip marks can be used to flag errant chips, such as memory devices having an error detected through ECC or other failure detection functions. Within a memory device, a Soft Post Package Repair (sPPR) function can target a specific row of a bank of memory to be remapped to a spare row within the same memory device. Correct operation of the sPPR function associated with a particular row in a memory device may not be validated during typical usage, and operability of the sPPR function may change over time, for instance, due to aging, environmental effects, power supply health, and other such factors.

Turning now to an overview of the aspects of the invention, one or more embodiments of the invention address the above-described shortcomings of the prior art by leveraging sPPR constraints of a memory device (e.g., DRAM) to verify the sPPR function. Issuing a second sPPR to the same bank group in DRAM overrides any previous sPPR executions in the bank group. A series of writes, reads, and mode register set (MRS) commands can be used to confirm a first pattern at a first targeted location prior to sPPR, write a second pattern at the first targeted location after sPPR, execute sPPR on a second targeted location in the same bank group as the first targeted location, and verify that the first targeted location holds the first pattern and the second targeted location holds the second pattern after remapping to the spare row.

The above-described aspects of the invention address the shortcomings of the prior art by using targeted writes and reads to track spare row implementation and verifying that the sPPR function is properly diverting traffic to the spare row. Invalid deployment of sPPR or out-of-specification memory devices could lead to traffic not being diverted to a spare row of a memory device. Embodiments of the invention can directly confirm during system operation whether a memory device is diverting traffic to the spare row or continuing to write and read from the original target row. Technical effects and benefits can include on-demand validation of sPPR functionality in memory devices using non-invasive testing.

With reference now to FIG. 1, a computer system 10 is illustrated in accordance with a non-limiting embodiment of the present disclosure. The computer system 10 may be based on the IBM Z architecture or POWER architecture, for example, offered by International Business Machines Corporation (IBM). The architecture, however, is only one example of the computer system 10 and is not intended to suggest any limitation as to the scope of use or functionality of embodiments described herein. Regardless, computer system 10 is capable of being implemented and/or performing any of the functionality set forth hereinabove.

Computer system 10 is operational with numerous other computing system environments or configurations. Examples of well-known computing systems, environments, and/or configurations that may be suitable for use with computer system 10 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Further, elements of the computer system 10 can be incorporated in one or more network devices to support computer network functionality, such as a network switch, a network router, or other such network support devices.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed computing environment, program modules may be located in both local and remote computer system storage media including memory storage devices.

As shown in FIG. 1, computer system 10 is shown in the form of a computing device, also referred to as a processing device. The components of computer system may include, but are not limited to, a processor 16 including one or more processing cores or processing units, a memory system 28, and a bus 18 that operably couples various system components including memory system 28 to processor 16.

Bus 18 represents one or more of any of several types of bus structures, including a memory bus or memory control, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that are accessible by computer system/server 10, and they include both volatile and non-volatile media, removable and non-removable media.

Memory system 28 can include an operating system (OS) 50, along with computer system readable media in the form of volatile memory, such as random access memory (RAM) 30 and/or cache memory 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory system 28 may include at least one program product having a set (e.g., at least one) of program modules that are configured to carry out the functions of embodiments of the disclosure.

The OS 50 controls the execution of other computer programs and provides scheduling, input-output control, file and data management, memory management, and communication control and related services. The OS 50 can also include communication protocol support as one or more drivers to implement various protocol layers in a protocol stack (e.g., transmission control protocol/internet protocol (TCP/IP)) to support communication with other computer systems across one or more computer networks.

The storage system 34 can store a basic input output system (BIOS). The BIOS is a set of essential routines that initialize and test hardware at startup, start execution of the OS 50, and support the transfer of data among the hardware devices. When the computer system 10 is in operation, the processor 16 is configured to execute instructions stored within the storage system 34, to communicate data to and from the memory system 28, and to generally control operations of the computer system 10 pursuant to the instructions.

Program/utility 40, having a set (at least one) of program modules 42, may be stored in memory system 28 by way of example, and not limitation, as well as the OS 50, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein at an application layer level in a communication protocol stack.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, data archival storage systems, etc.

Figure 2:
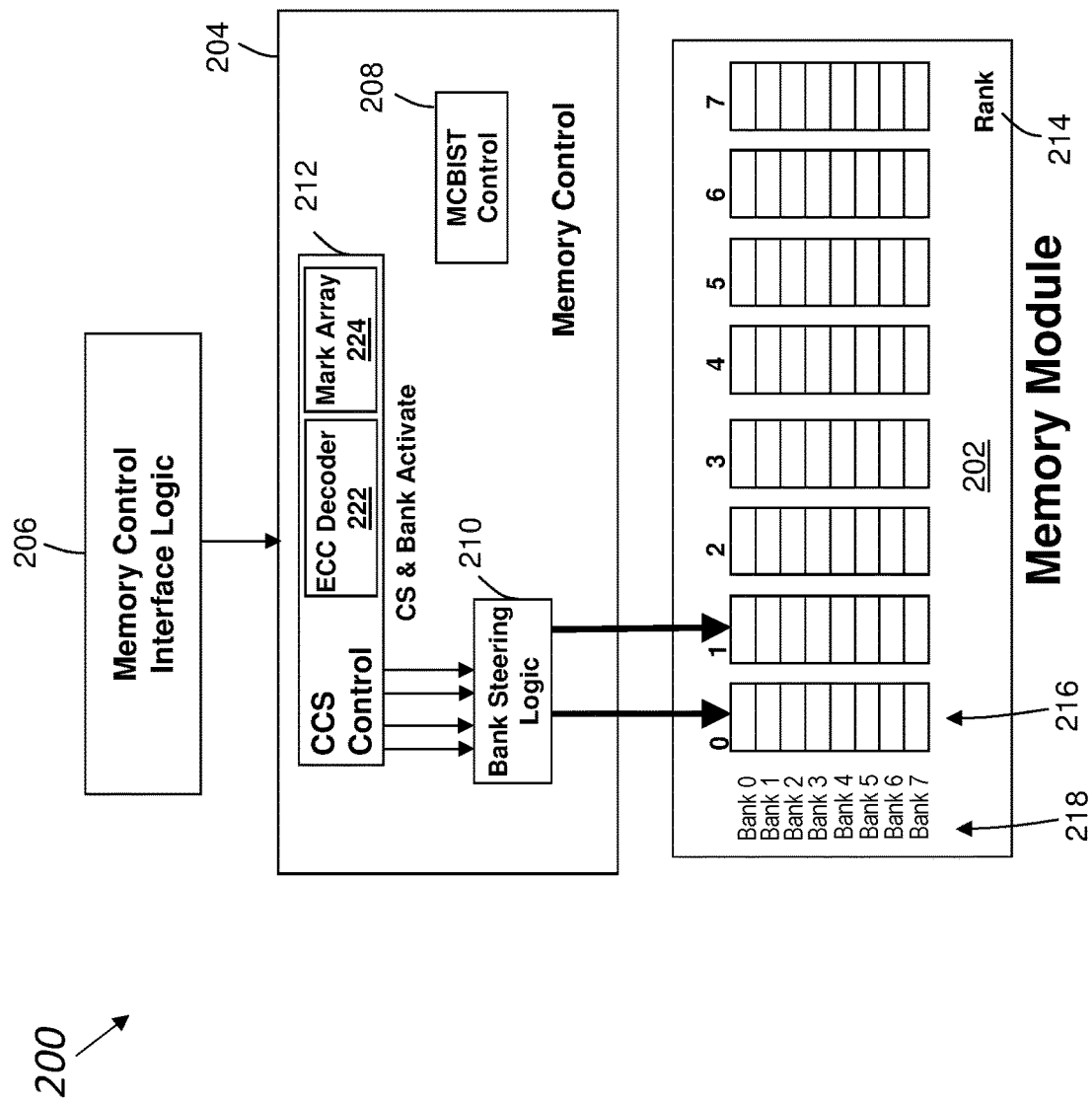
FIG. 2 is a block diagram of a memory system according to a non-limiting embodiment.

Turning now to a more detailed description of aspects of the present invention, FIG. 2 depicts a block diagram of a memory system 200 according to embodiments of the invention. The memory system 200 can be a portion of the memory system 28 of FIG. 1. The memory system 200 includes a memory module 202 connected to a memory control 204. The memory module 202 can be, for example, a DDR4 or DDR5 dual in-line memory module (DIMM). The memory control 204 can receive commands, addresses, and data from memory control interface logic 206, which can be part of the processor 16 of FIG. 1.

Memory devices can be grouped into ranks, where each rank defines a group of multiple memory devices that share a common chip select, such that they are collectively accessed across a memory bus that spans a width greater than a data width supported individually by each memory device. For example, a rank can include eight DRAM devices and an ECC device, where the ECC device is a type of memory device that stores ECC values to support error detection and correction. Each memory device can include addressable banks, where a typical memory access includes the same bank number accessed across all of the memory devices in a selected rank.

Ranks can be spread across different memory modules, such as DIMMs. Each DIMM can include one or more ranks. Rank, memory device, and bank selection can be driven by memory control 204. The memory control 204 can be a stand-alone device, incorporated within or distributed between a processor 16 and a memory buffer device. A memory buffer device can be located on a DIMM or on a planar assembly to convert requests from processor 16 into command and control signals to access memory devices and to perform error detection and correction. ECC or other known error correction codes may be used to detect and correct errors in words communicated to and from a memory device. For example, memory ECCs may use a combination of parity checks in various bit positions of a data word to allow detection and correction of errors. Every time data words are written into memory, parity checks can be generated and stored with the data. Upon retrieval of the data, an ECC decoder 222 can use the parity bits together with the data message in order to determine whether there was an error and to proceed with error correction if feasible.

The memory control 204 can be implemented as a processing circuit that executes control instructions, e.g., firmware program instructions or circuitry, to drive a memory control built-in self-test (MCBIST) control 208, bank steering logic 210, a command control sequencer 212, and/or other control aspects of the memory control 204. The memory control interface logic 206 may reside in the processor 16 of FIG. 1 or the memory control 204, for instance, to provide requested addresses and a data path to read and write data. The example of FIG. 2 also depicts a rank 214 on the memory module 202, which includes a plurality of memory devices 216 that are further divided into a plurality of bank groups 218. Each bank group 218 can include multiple rows in each of the memory devices 216. Although only one memory module 202 with eight memory devices 216 and eight bank groups 218 per memory device 216 are depicted in FIG. 2, it will be understood that there can be multiple memory modules 202 with various capacities and distributions of memory devices 216 with any number of bank groups 218 in embodiments.

The command control sequencer 212 can receive commands from the memory control interface logic 206 and generate chip select and bank activation signals for the bank steering logic 210. The command control sequencer 212 can also include an ECC decoder 222 and a mark array 224 to track errors, for instance, at a rank level, chip level, and/or bank level. The bank steering logic 210 can enable bank steering between bank groups 218 on the memory module 202.

Figure 3:
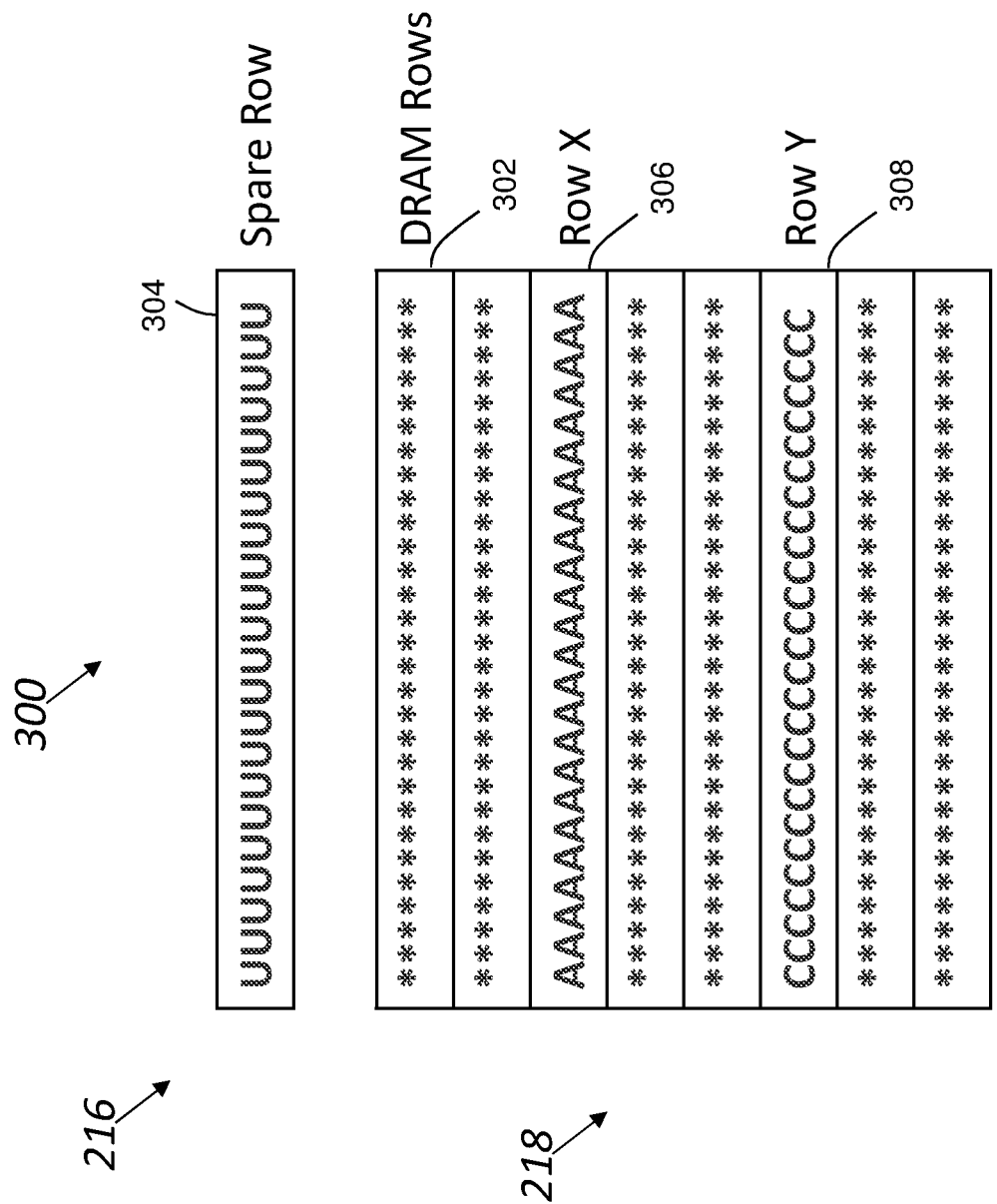
FIG. 3 is a block diagram of an initial configuration of a plurality of rows in a bank group of a memory device according to a non-limiting embodiment.

FIG. 3 is a block diagram of an initial configuration 300 of a plurality of rows 302 in a bank group 218 of a memory device 216 according to a non-limiting embodiment. In the example of FIG. 3, the contents of the rows 302 may be unknown or "don't care" initially as part of a testing process that may be initiated by the MCBIST control 208 of FIG. 2. A spare row 304 may be in an unknown or uninitialized state initially. In order to validate expected performance of the sPPR function for the bank group 218 of memory device 216, the MCBIST control 208 can write a first pattern (e.g., all A's) to a first target row 306, where a second target row 308 may contain corrupted data (e.g., illustrated as all C's).

Figure 4:
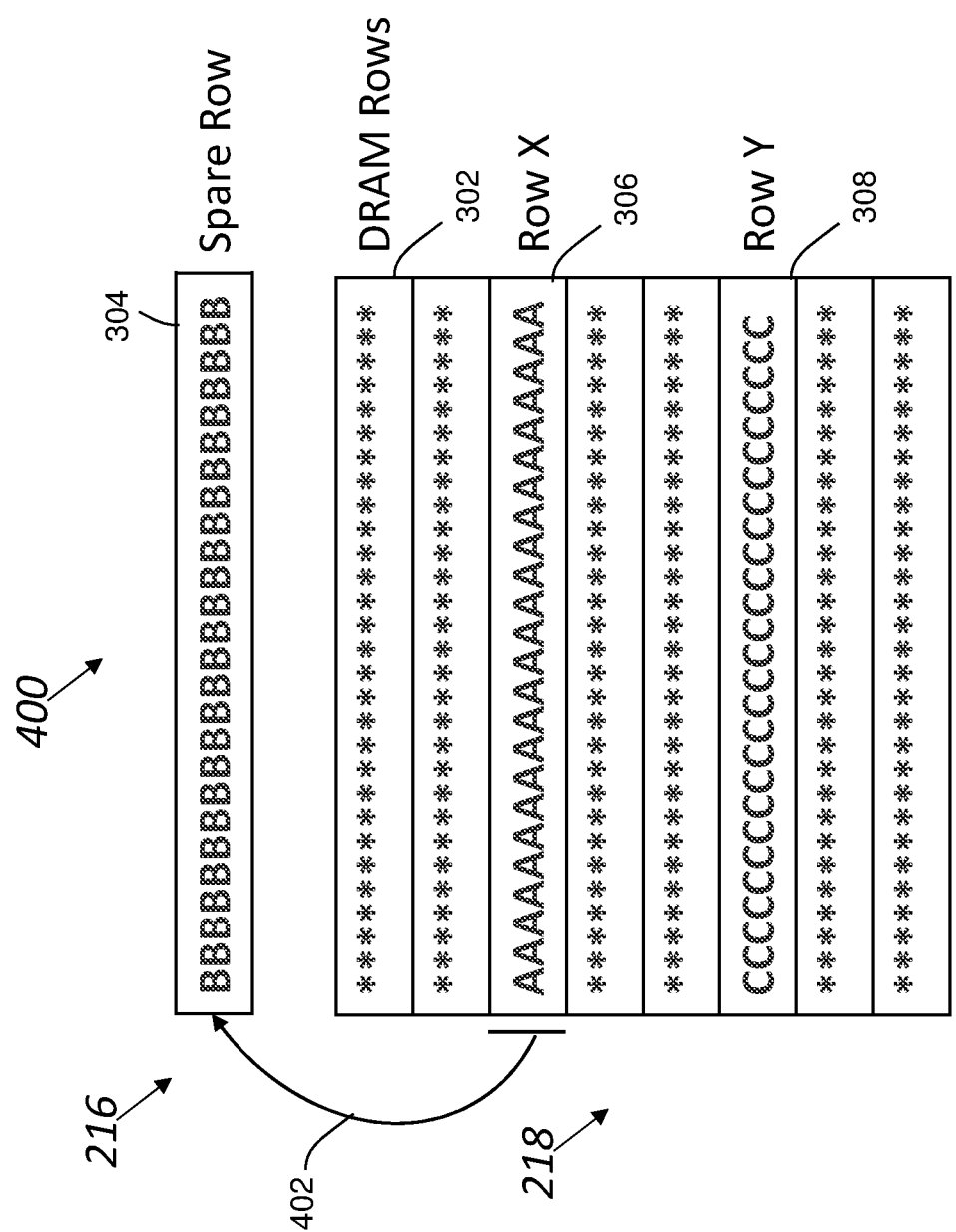
FIG. 4 is a block diagram of a first row in a bank group of a memory device remapped to a spare row according to a non-limiting embodiment.

FIG. 4 is a block diagram of a configuration 400 where the first target row 306 in bank group 218 of memory device 216 is remapped 402 to spare row 304 according to a non-limiting embodiment. Remapping 402 can be triggered by the memory control 204 of FIG. 2 (via the command control sequencer 212 of FIG. 2) executing an sPPR function for the first target row 306 of the memory device 216. If the sPPR function is operational, a subsequent write to the first target row 306 with a second data pattern, such as all B's, would update the spare row 304 rather than overwriting the first pattern of all A's in the actual location of the first target row 306.

Figure 5:
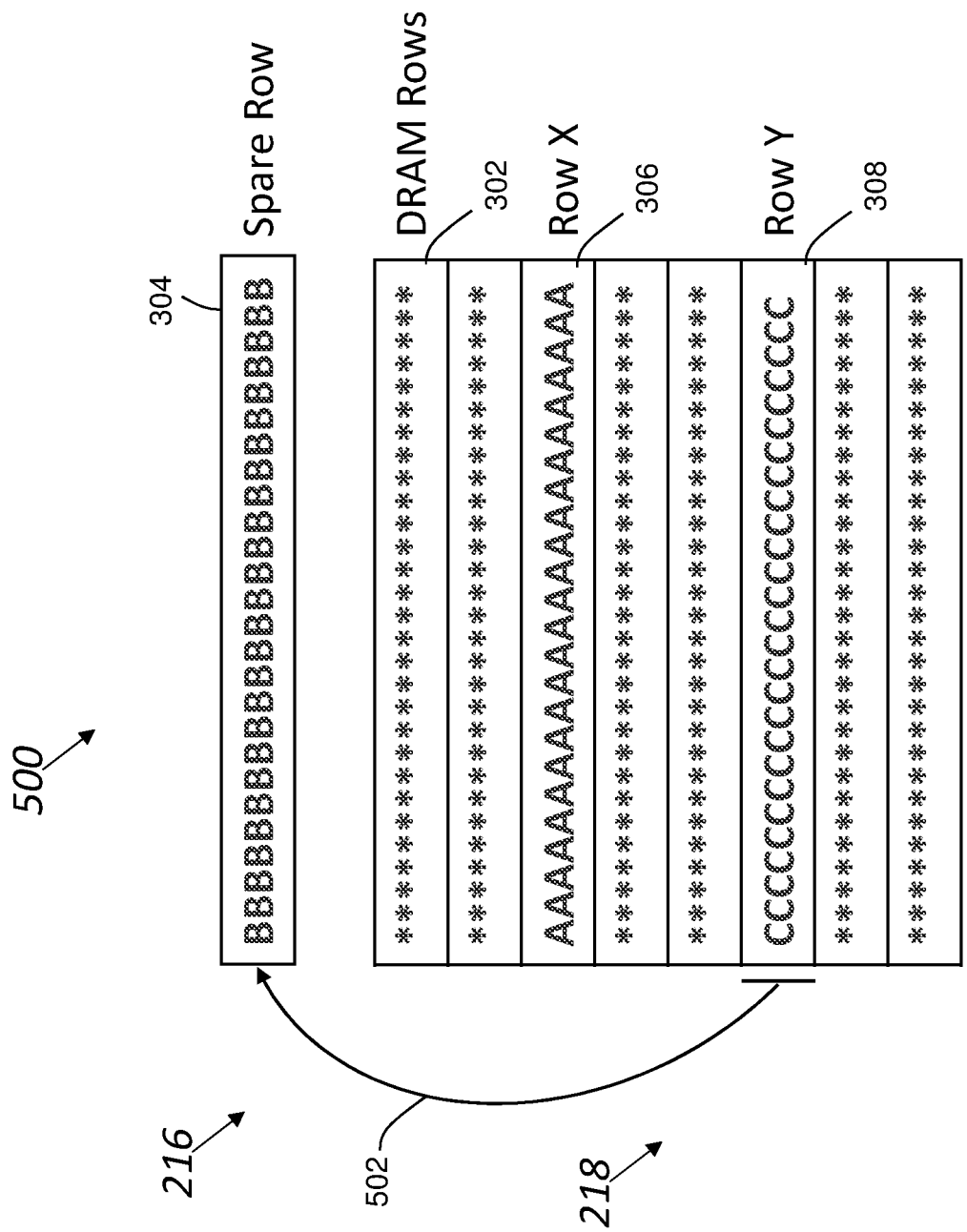
FIG. 5 is a block diagram of a second row in a bank group of a memory device remapped to a spare row according to a non-limiting embodiment.

FIG. 5 is a block diagram of configuration 500 where the second row 308 in bank group 218 of memory device 216 is remapped 502 to spare row 304 according to a non-limiting embodiment. Remapping 502 can be triggered by the memory control 204 of FIG. 2 (via the command control sequencer 212 of FIG. 2) executing an sPPR function for the second target row 308 of the memory device 216. If the sPPR function is operational, a subsequent read of the first target row 306 would result in reading the first pattern of all A's and a read of the second target row 308 would result in reading the second data pattern of all B's from the spare row 304 rather than reading the corrupted data (e.g., all C's) from the actual location of the second target row 308. Thus, the correct operation of the sPPR function can be validated, and the spare row 304 can be used as temporary storage after an error is detected in the bank group 218.

Figure 6:
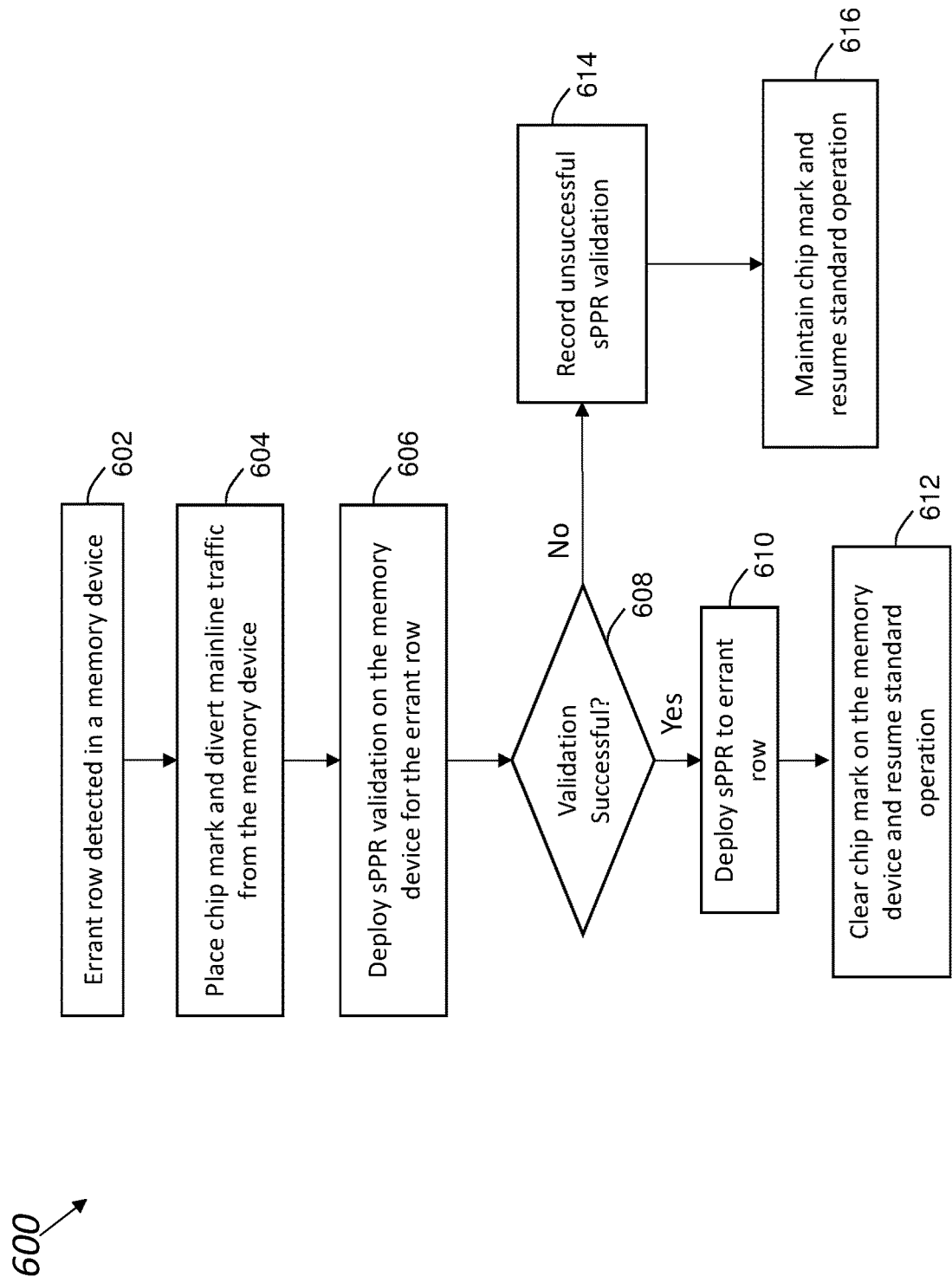
FIG. 6 is a flow diagram illustrating a method according to a non-limiting embodiment.

Turning now to FIG. 6, a flow diagram of a process 600 is generally shown in accordance with an embodiment. The process 600 is described with reference to FIGS. 1-6 and may include additional steps beyond those depicted in FIG. 6. The process 600 can be performed by the memory control 204 of FIG. 2 and/or can be controlled through operation of the processor 16 of FIG. 1.

At block 602, an errant row is detected in a memory device 216. For example, the ECC decoder 222 may detect an ECC error upon reading a location in the errant row, such as the second target row 308 of the memory device 216. At block 604, a chip mark can be placed for the memory device 216 (e.g., using mark array 224) and diverting mainline traffic from the memory device 216.

Figure 7:
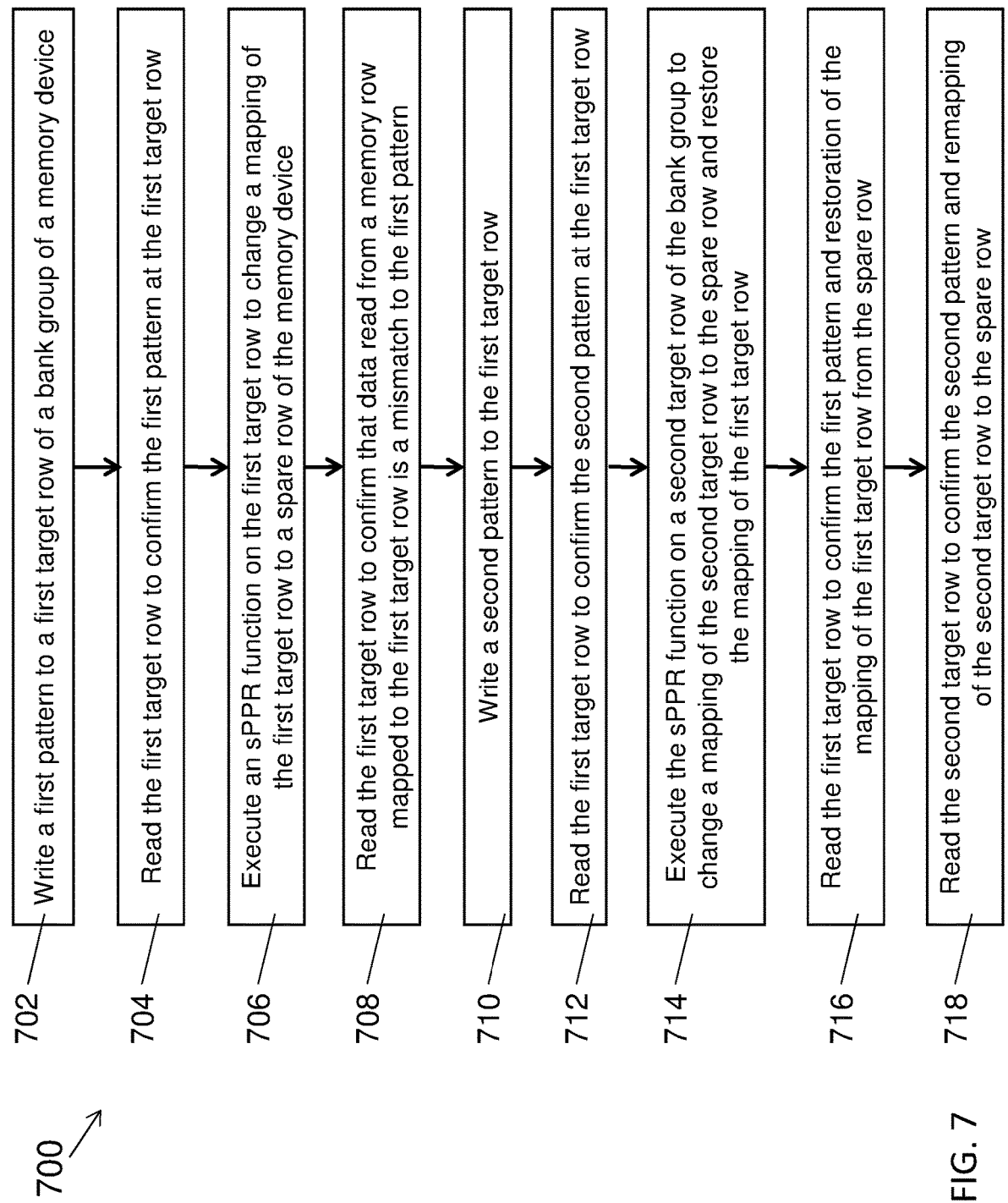
FIG. 7 is a flow diagram illustrating a method according to a non-limiting embodiment.

At block 606, validation of the sPPR function can be performed for the errant row, for instance, by performing the process 700 of FIG. 7. At block 608, a validation result of the process 700 can be determined to confirm whether the sPPR function operated as expected or not.

At block 610, the sPPR function can be deployed on the errant row (e.g., second target row 308) based on determining that the validation was successful. At block 612, the chip mark on the memory device 216 can be cleared from the mark array 224 and standard operation of the memory device 216 can be resumed with the errant row mapped to the spare row 304.

At block 614, an sPPR validation failure can be recorded based on determining that the validation was unsuccessful. The sPPR validation failure can be reported to a higher-level BIST function (not depicted) as part of fault detection and mitigation logic.

At block 616, standard operation of the memory device 216 can be resumed with the chip mark maintained on the memory device 216 in the mark array 224. The chip mark can be used to avoid storing new data values to a suspect or known faulty memory device 216.

Turning now to FIG. 7, a flow diagram of a process 700 is generally shown in accordance with an embodiment. The process 700 is described with reference to FIGS. 1-7 and may include additional steps beyond those depicted in FIG. 7. The process 700 can be performed by the memory control 204 of FIG. 2 and/or can be controlled through operation of the processor 16 of FIG. 1. As part of performing a validation of an sPPR function of a memory device 216, the process 700 can be performed.

At block 702, a first pattern (e.g., all A's) can be written to a first target row 306 of a bank group 218 of the memory device 216. At block 704, the first target row 306 can be read after writing the first pattern to the first target row 306 to confirm the first pattern at the first target row 306. This can be omitted in some scenarios, such as where the bank group 218 was previously initialized to known values. At block 706, the sPPR function can be executed on the first target row 306 to change a mapping 402 of the first target row 306 to a spare row 304 of the memory device 216 and divert a subsequent memory access request targeting the first target row 306 to the spare row 304. At block 708, the first target row 306 can be read to confirm that data read from a memory row 302 mapped to the first target row 306 is a mismatch to the first pattern (e.g., as the actual mapping may be incorrect in an errant memory device). At block 710, a second pattern can be written to the first target row 306. However, if the sPPR function is working, the write of the second pattern will actually be mapped 402 to the spare row 304. At block 712, the first target row 306 can be read after writing the second pattern to the first target row 306 to confirm the second pattern appears to be at the first target row 306, even though the second pattern is actually being read from the spare row 304 based on mapping 402. At block 714, the sPPR function can be executed on a second target row 308 of the bank group 218 to change a mapping 502 of the second target row 308 to the spare row 304 and restore the mapping of the first target row 306. At block 716, the first target row 306 can be read to confirm the first pattern and restoration of the mapping of the first target row 306 from the spare row 304. At block 718, the second target row 308 can be read to confirm the second pattern and remapping of the second target row 308 to the spare row 304. A result of validation can be reported for use by block 608 of FIG. 6.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
performing a validation of a soft post package repair (sPPR) function of a memory device, the validation comprising:
writing a first pattern to a first target row of a bank group of the memory device;
executing the sPPR function on the first target row to change a mapping of the first target row to a spare row of the memory device and divert a subsequent memory access request targeting the first target row to the spare row;
reading the first target row to confirm that data read from a memory row mapped to the first target row is a mismatch to the first pattern;
writing a second pattern to the first target row;
executing the sPPR function on a second target row of the bank group to change a mapping of the second target row to the spare row and restore the mapping of the first target row;
reading the first target row to confirm the first pattern and restoration of the mapping of the first target row from the spare row; and
reading the second target row to confirm the second pattern and remapping of the second target row to the spare row; and
reporting a result of the validation.

2. The method of claim 1, further comprising:
reading the first target row after writing the first pattern to the first target row to confirm the first pattern at the first target row.

3. The method of claim 2, further comprising:
reading the first target row after writing the second pattern to the first target row to confirm the second pattern at the first target row.

4. The method of claim 1, further comprising:
detecting an errant row in the memory device;
placing a chip mark and diverting mainline traffic from the memory device; and
performing the validation of the sPPR function for the errant row.

5. The method of claim 4, wherein the errant row is the second target row.

6. The method of claim 4, further comprising:
deploying the sPPR function on the errant row based on determining that the validation was successful;
clearing the chip mark on the memory device; and
resuming standard operation of the memory device with the errant row mapped to the spare row.

7. The method of claim 6, further comprising:
recording an sPPR validation failure based on determining that the validation was unsuccessful; and
resuming standard operation of the memory device with the chip mark maintained on the memory device.

8. A system comprising:
a processor;
a memory device; and
a memory control configured to interface with the processor and memory device to perform a plurality of operations comprising:
performing a validation of a soft post package repair (sPPR) function of the memory device, the validation comprising:
writing a first pattern to a first target row of a bank group of the memory device;
executing the sPPR function on the first target row to change a mapping of the first target row to a spare row of the memory device and divert a subsequent memory access request targeting the first target row to the spare row;
reading the first target row to confirm that data read from a memory row mapped to the first target row is a mismatch to the first pattern;
writing a second pattern to the first target row;
executing the sPPR function on a second target row of the bank group to change a mapping of the second target row to the spare row and restore the mapping of the first target row;
reading the first target row to confirm the first pattern and restoration of the mapping of the first target row from the spare row; and
reading the second target row to confirm the second pattern and remapping of the second target row to the spare row; and
reporting a result of the validation.

9. The system of claim 8, wherein the memory control is further configured to perform operations comprising:
reading the first target row after writing the first pattern to the first target row to confirm the first pattern at the first target row.

10. The system of claim 9, wherein the memory control is further configured to perform operations comprising:
reading the first target row after writing the second pattern to the first target row to confirm the second pattern at the first target row.

11. The system of claim 8, wherein the memory control is further configured to perform operations comprising:
detecting an errant row in the memory device;
placing a chip mark and diverting mainline traffic from the memory device; and
performing the validation of the sPPR function for the errant row.

12. The system of claim 11, wherein the errant row is the second target row.

13. The system of claim 11, wherein the memory control is further configured to perform operations comprising:
deploying the sPPR function on the errant row based on determining that the validation was successful;
clearing the chip mark on the memory device; and
resuming standard operation of the memory device with the errant row mapped to the spare row.

14. The system of claim 13, wherein the memory control is further configured to perform operations comprising:
recording an sPPR validation failure based on determining that the validation was unsuccessful; and
resuming standard operation of the memory device with the chip mark maintained on the memory device.

15. A computer program product comprising a computer readable storage medium having program instructions embodied therewith, the program instructions executable by processing circuitry to perform a plurality of operations comprising:

performing a validation of a soft post package repair (sPPR) function of a memory device, the validation comprising:
  writing a first pattern to a first target row of a bank group of the memory device;
  executing the sPPR function on the first target row to change a mapping of the first target row to a spare row of the memory device and divert a subsequent memory access request targeting the first target row to the spare row;
  reading the first target row to confirm that data read from a memory row mapped to the first target row is a mismatch to the first pattern;
  writing a second pattern to the first target row;
  executing the sPPR function on a second target row of the bank group to change a mapping of the second target row to the spare row and restore the mapping of the first target row;
  reading the first target row to confirm the first pattern and restoration of the mapping of the first target row from the spare row; and
  reading the second target row to confirm the second pattern and remapping of the second target row to the spare row; and
  reporting a result of the validation.

16. The computer program product of claim 15, wherein the operations further comprise:
  reading the first target row after writing the first pattern to the first target row to confirm the first pattern at the first target row; and
  reading the first target row after writing the second pattern to the first target row to confirm the second pattern at the first target row.

17. The computer program product of claim 15, wherein the operations further comprise:
  detecting an errant row in the memory device;
  placing a chip mark and diverting mainline traffic from the memory device; and
  performing the validation of the sPPR function for the errant row.

18. The computer program product of claim 17, wherein the errant row is the second target row.

19. The computer program product of claim 17, wherein the operations further comprise:
  deploying the sPPR function on the errant row based on determining that the validation was successful;
  clearing the chip mark on the memory device; and
  resuming standard operation of the memory device with the errant row mapped to the spare row.

20. The computer program product of claim 19, wherein the operations further comprise:
  recording an sPPR validation failure based on determining that the validation was unsuccessful; and
  resuming standard operation of the memory device with the chip mark maintained on the memory device.

* * * * *